United States Patent [19]

Mroz

[11] Patent Number: 6,054,220
[45] Date of Patent: Apr. 25, 2000

[54] SILICA-COATED ALUMINUM NITRIDE POWDERS WITH IMPROVED PROPERTIES AND METHOD FOR THEIR PREPARATION

[75] Inventor: Thomas J. Mroz, Kenmore, N.Y.

[73] Assignee: Advanced Refractory Technologies, Inc., Buffalo, N.Y.

[21] Appl. No.: 09/153,587

[22] Filed: Sep. 15, 1998

Related U.S. Application Data

[60] Provisional application No. 60/058,833, Sep. 15, 1997.

[51] Int. Cl.[7] ............................................. B32B 5/16
[52] U.S. Cl. ............................................. 428/403; 428/404
[58] Field of Search ................................... 428/403, 404

[56] References Cited

U.S. PATENT DOCUMENTS

| | | | |
|---|---|---|---|
| 3,767,458 | 10/1973 | Moore, Jr. | 117/100 S |
| 3,887,740 | 6/1975 | Foster et al. | 428/116 |
| 4,421,799 | 12/1983 | Novinski | 427/423 |
| 4,429,003 | 1/1984 | Fredriksson et al. | 428/317.9 |
| 4,720,419 | 1/1988 | Cairns et al. | 428/209 |
| 5,028,352 | 7/1991 | Hietala et al. | 252/315.6 |
| 5,098,740 | 3/1992 | Tewari | 427/215 |
| 5,183,710 | 2/1993 | Gerbino | 428/405 |
| 5,234,712 | 8/1993 | Howard | 427/215 |
| 5,304,520 | 4/1994 | Dwivedi | 501/127 |
| 5,340,393 | 8/1994 | Jacobson | 106/492 |
| 5,474,583 | 12/1995 | Celikkaya | 51/309 |

*Primary Examiner*—Hoa T. Le
*Attorney, Agent, or Firm*—Kellie Muffolefto Ulrich

[57] ABSTRACT

Disclosed herein is a silica coated powder that provides improved hydrolysis stability and damage tolerance compared to silica coated powders previously described and commercially available. The improved coated powder of this disclosure is clearly distinguished from other silica coated powders, in that the silica coating of the disclosed product is dense, or contains only closed pores, and as such does not allow for water penetration to the AlN core via permeability or any other means. Further disclosed is the process by which such improved coated powders can be produced. The process utilizes any form of silica coated aluminum nitride, which can be produced by any number of means as described in the literature. Such powders are then subjected to a further heat treatment which causes the closure of porosity and densification of the silica coating. The resulting powder exhibits similar surface area to the original core particle, and can be shown to withstand substantial hydrolysis attack, even by hot, pressurized steam.

18 Claims, 2 Drawing Sheets

SILICA-COATED ALUMINUM NITRIDE POWDERS WITH IMPROVED PROPERTIES AND METHOD FOR THEIR PREPARATION

This application is entitled to benefit of U.S. Provisional Patent Application Ser. No. 60/058,833, filed Sep. 15, 1997, which is hereby incorporated by reference.

FIELD OF THE INVENTION

This invention relates to improved coated aluminum nitride powders which are able to withstand substantial exposure to atmospheric moisture without substantial reaction and degradation.

BACKGROUND OF THE INVENTION

The Electronic Molding Compound (EMC) industry has historically utilized various forms of silicon dioxide powder (silica, $SiO_2$) as inert, inorganic fillers in thermosetting resin compositions for electronics encapsulation applications. The silica, while providing some degree of improved thermal conductivity and physical properties, is predominantly used to reduce the water adsorption of the composite compound, especially when used in very high solids concentration. The industry has many years of experience with silica, and thus most of the EMC compositions used are optimized to maximize the compatibility between the epoxy matrix and the $SiO_2$ filler. Further, the low thermal expansion of silica is well suited to this application, as it provides a product that more closely matches the expansion of the silicon chips and thus reduce thermal stresses. In cases where thermal conductivity was an important design criteria, thermal management of components encapsulated with this material have historically been accommodated by incorporation of metal slugs within the compounded encapsulant, or by heat spreaders attached above the encapsulation material.

Continued need for reduced size in electronic packages is necessitating the removal of the metal heat spreaders and instead, removing heat by improving the thermal conductivity of the encapsulation material directly. Thus, the industry has been evaluating the use of thermally conductive fillers in EMC compositions, including aluminum oxide (alumina) and aluminum nitride. Alumina has already found some niche applications in this regard. However, its high hardness, coupled with its higher thermal expansion coefficient and moderate thermal conductivity makes it of limited value to the industry.

Aluminum nitride (AlN) is significantly more thermally conductive than either silica or alumina; providing a large potential improvement in this property in the compounded polymer. Additionally, AlN exhibits a relatively low thermal expansion coefficient, and is thus it provides for a better match with the silicon chips than alumina. Also, AlN is not as hard as alumina, and thus should reduce equipment wear during processing.

However, aluminum nitride in an as-synthesized form is not suitable for EMC applications due to its tendency to hydrolyze in contact with water or humid environments. The hydrolysis reaction results in the formation of aluminum oxide on the surface of the AlN particles, which reduces their thermal conductivity. It also forms ammonia gas, which can swell and eventually crack the polymer matrix. Thus, in order to use AlN in this application, the material must be made insensitive to moisture to fully protect against hydrolysis. In concept, AlN can be rendered water-stable by application of a coating to all particle surfaces. One such form, a silica coated AlN powder, has the added benefit of presenting a similar surface chemistry as the silica powders already used widely in the industry, thus requiring little change in existing formulations or processing from current practice.

Prevailing barriers to widespread utilization of AlN and coated AlN powders in the EMC industry include concerns over long-term hydrolytic stability, and mechanical stability of the coating. However, a growing need exists to resolve the issue of heat removal in electronics through the encapsulant, which is served by the thermal properties of AlN. Thus, methods of preparing coated AlN that consistently exhibit excellent hydrolysis stability are of keen interest.

A number of companies, including ART, have developed coated powders for applications requiring resistance to hydrolysis, such as for EMCs. Coating powders with silica to protect the powders from hydrolysis has been discussed in the literature for a number of powders, including, for instance, aluminum nitride and magnesium oxide. The physical characteristics determined for silica coated AlN powders in particular include coating thickness of 300–400 nm, oxygen contents in the 2–4% range, and surface area ranging from 8–12 $m^2/g$. These powders provide a substantial improvement in hydrolysis stability compared to uncoated AlN powders. However, materials designated for use in the EMC application must pass extremely rigorous tests, including those that aggressively investigate the hydrolysis stability of the material in application-relevant conditions. These hydrolysis tests include 85/85 testing, which involves exposing the material to a controlled environment at 85% relative humidity and 85° C. and evaluating hydrolysis-related weight gain over 1000 hours; and the Highly Excellerated Stress Test (HAST) where samples are exposed to 100% humid conditions at high temperatures and pressures. In many cases, HAST testing is performed at 155° C. and ~60 psi, for periods of tens to hundreds of hours.

While silica coated AlN powders have exhibited significantly improved performance in these tests compared to uncoated AlN, further improvements in hydrolysis stability is of interest to the EMC industry. Further, while the silica coated AlN powder exhibits very good hydrolysis stability as prepared, it must withstand significant mechanical processing in the EMC application. This mechanical processing can damage the silica coatings on the particles and cause a reduction in stability of the material. Thus, it is important also to provide a coated AlN product that exhibits damage tolerance and retains high hydrolysis stability.

Significant prior art exists which describes processes and products related to silica coated inorganic powders. However, in all cases, the described processes concentrate on the procedures that cause the deposition of silica onto the inorganic particles, which in all cases involves nucleation and growth of the silica coating in a particulate mode in the vicinity of the surfaces of the inorganic particles. In some cases, thermal processing may follow the deposition process, but these thermal processes always involve moderately low temperatures, and typically are performed to facilitate low temperature reactions such as solvent evolution or phase modification. The typical process by which silica coatings are formed on inorganic particles involves the hydrolysis of silicon-based alkoxides such as tetraethylorthosilicate in the presence of the core inorganic particles. The hydrolyzed silica forms fine particles with diameters on the order of nanometers, which then coat the inorganic cores by a deposition process, assisted by hydrogen-type bonding between the coating particles and the cores. The deposited silica particles can be assumed to maintain their size and shape due to the relatively low temperatures of the process, and thus the particles also retain their other physical attributes, including surface area.

The high surface area measured on coated powders relative to initial, uncoated powder is suggestive of the structure of the coating, and is critical to an understanding of the invention described in this patent. In the specific case of silica coated AlN, the coarse (uncoated) AlN powders used for these applications exhibit surface areas of approximately 1 $m^2/g$. In order for the overall surface area of the silica coated AlN powders to be ~10 $m^2/g$, an extremely high surface area must be attributed to the to the coating. Given the small thickness of the coating layer, it can be shown by calculation that this increase in surface area cannot be due to any possible increased surface roughness related to the coating. Rather, it is expected that the coating consists of the very small, individual silica particles that precipitated during the coating process and subsequently bonded in the heat treating step. It is these fine particles themselves that are contributing so strongly to the surface area of the overall powder sample. In order for the overall powder to exhibit a 10 $m^2/g$ surface area, the coating itself would need to be in excess of 200 $m^2/g$. If the silica particles are assumed to be spherical, their particle diameter would be ~10 nanometers to yield this high surface area. Such fine particle sizes are not unexpected for inorganic particles such as silica prepared by hydrolysis of alkoxide materials.

Further, these fine particles can only influence the surface area of the bulk powder if their surfaces are exposed to the analysis technique. Surface area is typically measured by adsorbtion and desorbtion of nitrogen atoms on the intended samples—because nitrogen will adsorb to specific volumes on exposed surfaces, the desorbed nitrogen content can be correlated to the surface area of the sample. However, it must be noted that this process can only interrogate exposed porosity, as it requires the penetration, adsorbtion and desorbtion of the nitrogen on the surfaces during the course of the procedure. Thus, in the case of silica coated AlN particles, where the measured surface area is on the order of a magnitude higher than the original uncoated particles, such high surface areas can only come about if the silica coating is highly porous, i.e., that the silica particles are packed together, but not consolidated; such that the void regions between particles allows for interaction with the external environment. Thus, assuming the coating is constructed of bonded spherical particles of silica (rather than an impervious silica shell), it can be estimated from a very conservative view of monosized particle packing theory that the pore volume in the coating is greater than at least 30%, with mean pore diameter of ~10 angstroms. (not to scale) is a representation of an AlN sphere about which is deposited a coating of SiO2 in the form of discrete spheres (drawing not to scale). Such a coating could be expected to form a cohesive layer and adhere to the particle, thereby provide some degree of water resistivity. Such fine porosity can be expected to represent a significant barrier to fluid water penetration, and even exchange of vaporous water with the AlN core. However, the permeable nature of the coating will eventually result in water penetration and hydrolysis of the AlN core. Should this penetration and subsequent reaction cause disruption of the surface coating, then water penetration and the resulting hydrolysis will increase in rate until the AlN core integrity has been compromised altogether.

When using such a coated powder for filled polymer applications, the ramifications of the coating structure are highly important. Most importantly, the fact that the coating is permeable suggests that it is not an absolute shield against hydrolysis of the underlying AlN. While the small average pore size and relatively low pore volume will significantly decrease water mobility, it can be expected that water penetration, particularly in the form of water vapor, will eventually occur, resulting in hydrolysis and slow decay of the AlN particles.

Hydrolysis testing involves direct exposure of the sample water-bearing environments, such as 85% relative humidity air at 85° C. Weight gain due to these conditions is used to determine onset and extent of they hydrolysis reaction. The silica materials typically used in this industry routinely exhibit moisture-related weight gains on the order of 0.5–1.0% as no reaction occurs between the water and silica other than typical surface adsorbtion. FIG. 2 shows the degradation of a conventionally coated AlN powder (such as the product offered commercially by Dow Chemical under the trade name of SCAN™) over a period of time at high temperature and humidity conditions. Weight gains above about 0.5% have been shown to be irreversible, which suggests a chemical reaction has occurred between the moisture and the core AlN. Note that weight gain greater than 0.5% is observed after about 350 hours of exposure, and ultimate weight gains are significantly above the nominal 1% level that is typical for silica fillers.

Additionally, it can be expected that the porous nature of the silica to coating will cause the coating to be mechanically weaker than a dense coating. The porosity in the coating can be expected to decrease the intra-coating strength as well as the coating-core particle bond. Thus, when handling such coated powders in commercial volumes and existing process machinery, the possibility of erosion, wear or fracture and spallation of the coating is real, and the result can be expected to yield an unacceptable coated product.

SUMMARY OF THE INVENTION

Disclosed herein is a silica coated powder that provides improved hydrolysis stability and damage tolerance compared to silica coated powders previously described and commercially available. In particular, the process is described for coating aluminum nitride, but coating of other hydrolyzeable inorganic materials, such as magnesium oxide, would also benefit from this process. The improved coated powder of this disclosure is clearly distinguished from other silica coated powders, in that the silica coating of the disclosed product is dense, or contains only closed pores, and as such does not allow for water penetration to the AlN core via permeability or any other means. The fact that the silica coating exhibits essentially no open pores can be proven by the fact that powder so coated show little or no increase in measured surface area as compared to the original, uncoated powder. Silica coated powders of the prior art all exhibit significant increases in surface area, due to the porous, particulate nature of the silica coating itself.

Further disclosed is the process by which such improved coated powders can be produced. The process utilizes any form of silica coated aluminum nitride, which can be produced by any number of means as described in the literature. Such powders are then subjected to a further heat treatment (also described as calcination) which causes the closure of porosity and densification of the silica coating. This densification occurs well below any known temperature whereby a liquid can exist in the reaction system, and in fact occurs at temperatures much lower than typically expected for solid state sintering of silca particles. Thus, the densification of the coating with commiserate elimination of permeable porosity at the temperature indicated (ie., below 1300° C.) is unexpected based on the available literature.

DETAILED DESCRIPTION OF THE INVENTION

The inventor has determined that exposing these porous silica coated powders to relatively high temperatures, specifically above 900° C. and preferably above 1050° C., but below the melting point of silica (ie. <~1750° C.), has the result of reducing the surface area of the coated powder to the original level of the core AlN particle. In fact, this surface area reduction has been shown to occur at temperatures below 1300° C. which is well below the anticipated temperature whereby sintering and densification of silica can be expected to occur. This effect is relatively independent of the process atmosphere and time at temperature, and thus can be performed in a non-oxidizing atmosphere such as nitrogen if oxidation of the core AlN particle is of concern, and can also be performed in air if desired. This invention represents a substantial improvement in water resistant coating by minimizing or eliminating the porosity in the coating described above.

Figure 1:
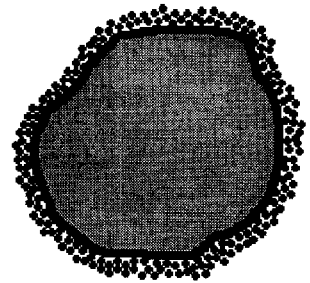
FIG. 1. Schematic representation of an AlN particle coated with a porous $SiO_2$ coating as formed by existing technology (schematic not to scale)
Figure 2:
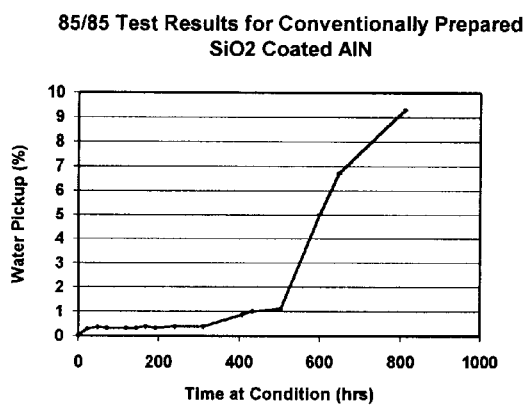
FIG. 2. Moisture stability of standard porous $SiO_2$ coated AlN powder prepared by existing methods FIG. 3. Schematic representation of an AlN particle coated with a dense $SiO_2$ coating as formed by the method disclosed herein (schematic not to scale)
Figure 3:
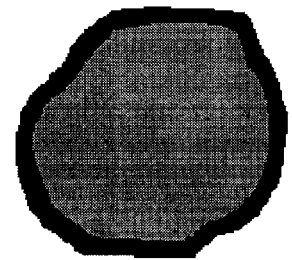
Figure 4:
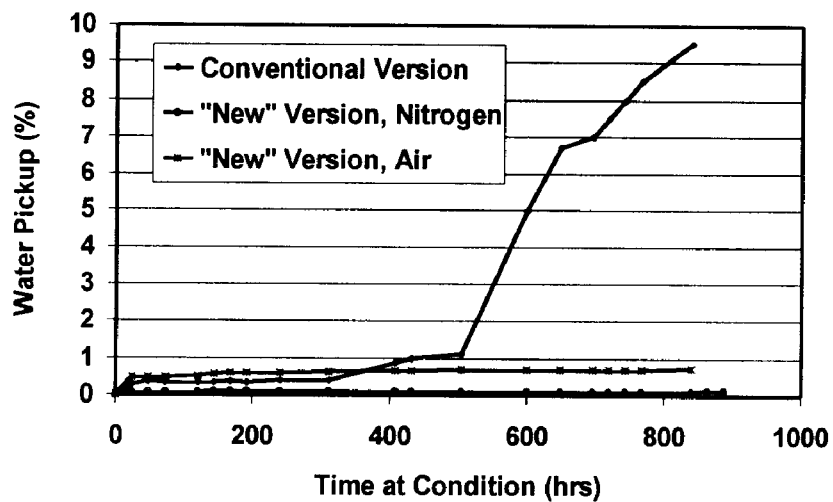
FIG. 4. Relative moisture stability of $SiO_2$ coated aluminum nitride with various coating methods FIG. 5. Decrease in surface area of coated powders as a function of calcining temperature.

Heating these $SiO_2$ particle coatings on AlN at temperatures above about 900° C., and more desirably above about 1050° C., but below about 1300° C. has the unexpected result of coalescence of the silica particles to a dense coating. By calcining these coated powders at the indicated temperature, virtually all of the surface area assigned to the silica particles is eliminated, suggesting densification or coalescence of the coating and removal or occlusion of all open porosity. Presumably, the coating either densifies and collapses, or the porosity becomes unavailable to the surface via closure. The end result would be the same in either case; a measured surface area that is roughly equivalent to the surface area of the original, uncoated AlN particles and an impermeable protective shell surrounding the inorganic core particle. This description is supported by the observation that the silica coating does not change the average particle diameter sufficiently to change the surface area by geometric means alone. FIG. 3 (not to scale) is a representation of such a coating.

This technology represents an alternative to existing coated AlN powders given that this powder exhibits a dense, impervious coating in a shell-like form. This type of coating does not typically form when silica is applied to powder surfaces due to the coalescence of silica nanoparticles during initial application (via condensation from a gas, precipitation from a sol, etc.). Further heat treating is rarely of a sufficient temperature to result in coalescence and densification of the coating because of issues of potential oxidation of the AlN core, as well as the typically high temperature required for melting pure silica (above 1700° C.).

Figure 5:
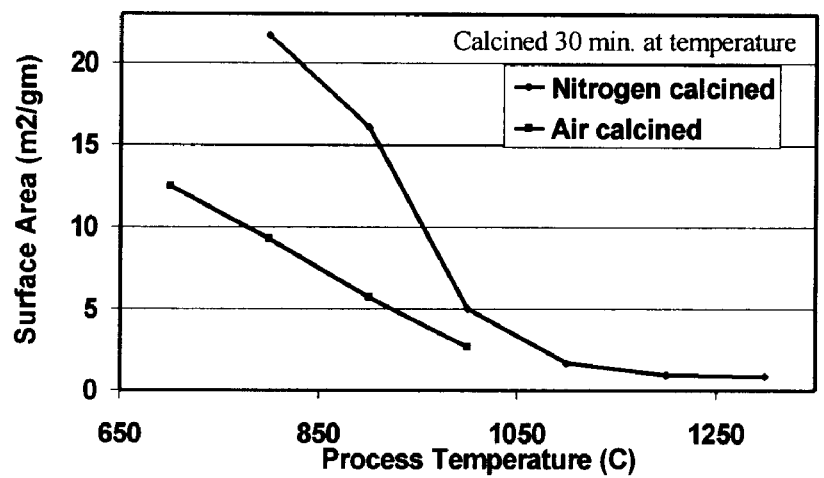

This calcination process can be conducted in different atmospheres. In air, the coalescence is accompanied by some oxidation of the underlying AlN particles, but not to the total consumption of the AlN. In nitrogen, coalescence at 1200° C. and above results in complete elimination of the coating pore effect on surface area without a significant change in overall oxygen content. This suggests that neither oxidation nor reduction of the coating occurs, which is a favorable condition. FIG. 5 shows the change in sample surface area with processing temperature for samples calcined in both air and nitrogen atmospheres. Results similar to the nitrogen results have been shown for an argon atmosphere.

As a result of the decreased open porosity in this coating form, the resistance of the material to hydrolysis is greatly improved. Hydrolysis test results for several coated powders including the improved material can be found in FIG. 5. Coated particles that have not been calcined show an initial increase in weight due to undesirable chemical adsorption within the coating porosity, followed by a period of stability, then rapid destabilization via hydrolysis. The onset of hydrolysis can be quite variable in these powders, ranging from exposure times of 250–500 hours. Weight gains generally greater than 1.0 wt % are unacceptable after 85/85 exposure for 500–1000 hours.

In contrast, the calcined powders show nearly no initial adsorption of water due to their very low surface areas. Hydrolysis stability is observed throughout the extent of the test, which for the electronic industry is often considered excellent at 1000 hr. Samples calcined in air show somewhat greater moisture adsorption in early testing, but show no catastrophic hydrolysis through exposure times above 800 hr. In the case where more aggressive HAST testing is performed, products of this invention again show significant improvement over materials representing the prior art.

The following examples are illustrative only and should not be construed as limiting the invention, which is properly delineated in the appended claims.

EXAMPLES

1. A standard commercial grade of AlN powder was coated using a proprietary method to form an $SiO_2$ layer on the AlN particles. The coating process was performed in such a way as to provide two separate coatings of SiO2 of nominally 300 nm thickness each on all particle surfaces. The coated AlN powder exhibited a high surface area of 15 $m^2$/g, compared to 0.8 $m^2$/g as measured for the uncoated aluminum nitride. This additional surface area is attributed to the silica coating, which implies that the silica coating is porous and thus non-hermetic.

Moisture testing was performed on both the uncoated and coated AlN powders using a standard 85/85 test (ie., 10 grams of powder exposed to 85% relative humidity at 85° C.). Weight change was measured every 24 hours to determine the degree of reaction.

Uncoated aluminum nitride (Sample A in Table I) shows nearly immediate reaction in the form of substantial weight gain. The coated aluminum nitride (Sample B, Table I) shows improved performance compared to the uncoated powder, but has significantly exceeded a 1% weight gain after about 500 hours of exposure. Thus, the silica coating significantly improves the moisture resistance of the AlN powder, however it eventually allows permeation of water and subsequent reaction.

2. A silica coated AlN powder was prepared in the same manner as Sample B, with the exception that only one layer of silica was deposited on the particle surfaces. These coated powders were calcined at 1300° C. for 30 minutes in a nitrogen atmosphere. The resulting powder (Sample C, Table I) exhibits a low (0.8 m²/g) surface area, which is essentially the same surface area of the uncoated AlN powder. Retention of the silica coating was confirmed by trace silicon analysis. Thus it is inferred that the silica coating has densified or otherwise lost its permeable nature due to the calcining process, resulting in a coating that conforms to the core AlN particles and provides no additional surface area from pores, cracks or surface angularity Coated and calcined powders were tested using the 85/85 test and shown to exhibit less than 0.15% weight gain even after 1000 hours of exposure. This degree of stability proves that the silica protective coating is intact. Further, the coating has been improved such that it does not allow permeation of moisture to the AlN particle cores and thus protects the AlN from hydrolysis reaction.

3. A commercially available $SiO_2$ coated AlN powder (SCAN™, Dow Chemical) was obtained and evaluated (Sample D, Table I). The powder as-received exhibited a surface area of 10 m²/g, suggesting that the silica coating was permeable in a similar fashion to Sample B. The sample was evaluated in the 85/85 test and showed significant reaction with moisture at about 350 hours of exposure.

4. The commercially available SiO2 coated AlN powder (Sample D) was calcined in the same manner as Sample C. After calcining (Sample E, Table I), the surface area was reduced to about 0.53 m²/g. The hydrolysis stability, as determined by the 85/85 test was in excess of 1000 hours. Thus, while the initial method of silica coating were different, the calcining process successfully improved the hydrolysis stability of the commercial as well as the experimental samples by minimizing the permeability of the coatings.

6. Coated powders were calcined in the same manner as Sample C, but in an air atmosphere instead of nitrogen, and at temperatures of 800 and 1000° C. (Samples K and L in Table I, respectively). Powder surface area decreased and oxygen content increased as temperature increased. Hydrolysis stability for both samples was significantly improved over uncalcined powders. Initial weight gains were moderate, in the 0.1–0.2% range. Hydrolysis stability was observed in both samples in excess of 1000 hours. Thus, while this process may oxidize the powder, it provides for improved hydrolysis stability due to the reduced porosity of the silica coating.

7. Coated powders were calcined in the same manner as Sample C, but in an argon atmosphere instead of nitrogen and at 1200° C. (Sample M . Table I). The resulting powder showed similarly low surface area (0.8 m²/g), and excellent hydrolysis stability (in excess of 1000 hours). Thus, the use of an inert atmosphere has no degrading effect on the nature of the calcination process with respect to the hydrolysis stability of the final product.

8. Coated powders were calcined in the same manner as Sample C, with the exception that the calcination times were reduced to 5, 10 and 20 minutes and the calcination temperature was 1200° C. (samples N, O, and P, respectively in Table I). All resulting powders showed low surface areas (~1 m²/g), and excellent hydrolysis stability (>1000 hours). Thus, even short calcining times result in the improved nature of the coated AlN powder when the calcining temperature is suitably high.

TABLE 1

Summary of process parameters and powder characteristics for examples.

| Sample | | Process Parameters | | | | Power Characteristics | | |
|---|---|---|---|---|---|---|---|---|
| Code | Initial material | Atmsp. | Temp [C.] | Time [min] | $O_2$ [wt %] | SSA [m2/g] | Hours 85/85 | Weight gain [wt %] |
| A | AlN no Si—O coating | (no heat treatment) | | | 0.28 | 0.73 | 24 | >10% |
| B | AlN with ART standard Si—O coating | (no heat treatment) | | | 3.1 | 17.9 | 504 | 34 |
| C | Same as B | $N_2$ | 1300 | 30 | 2.4 | 0.8 | 1008 | 0.12 |
| D | Commercial powder ("SCAN ™") | (no heat treatment) | | | 3.2 | 10.3 | 800 | 11 |
| E | Same as D | $N_2$ | 1300 | 30 | 2.5 | 0.53 | 1090 | 0.04 |
| F | Same as B | $N_2$ | 900 | 30 | 3.1 | 16.1 | 288 | 17 |
| G | Same as B | $N_2$ | 1000 | 30 | 3.1 | 12.2 | 640 | 6.1 |
| H | Same as B | $N_2$ | 1050 | 30 | 3.0 | 10.2 | 768 | 1.5 |
| I | Same as B | $N_2$ | 1100 | 30 | 2.8 | 1.63 | 1000 | 0.1 |
| J | Same as B | $N_2$ | 1200 | 30 | 3.0 | 0.9 | 1000 | 0.05 |
| K | Same as B | Air | 800 | 30 | 2.9 | 9.3 | 1056 | 0.35 |
| L | Same as B | Air | 1000 | 30 | 13.3 | 2.6 | 1008 | 0.02 |
| M | Same as B | Argon | 1200 | 30 | 2.8 | 0.9 | 888 | 0.04 |
| N | Same as B | $N_2$ | 1200 | 5 | 2.6 | 1.1 | 1090 | 0.08 |
| O | Same as B | $N_2$ | 1200 | 10 | 2.7 | 1.3 | 912 | 0.02 |
| P | Same as B | $N_2$ | 1200 | 20 | 2.7 | 1.0 | 860 | 0.02 |

5. Additional samples of calcined powders were prepared in the same manner as Sample C, but calcined at temperatures of 900, 1000, 1050, 1100, and 1200° C. (Samples F, G, H and I, respectively in Table I). The powder surface area showed initial reduction after calcining at 900° C., and showed complete reduction (ie., reached the level of the uncoated powder) at 1200° C. Hydrolysis stability was poor (>>1% weight gain) in samples below 1050° C., and was excellent (<<1% weight gain after 1000 hours exposure) in samples calcined at above 1100° C. (see FIG. 5).

9. Coated AlN powders were prepared in a similar manner to that of Sample B and Sample C, (Samples Q and R respectively), with the exception that sample R was calcined at 1200° C. Samples were tested for water stability using a more aggressive test method (referred to in the electronics industry as Highly Excellerated Stress Test or HAST). In this case, 10 gram samples were exposed to 100% humid conditions at 155° C. and ~60 psi. Sample Q exhibited a weight gain in excess of 1% after test exposure of 47 hours. Sample R showed no measureable weight gain even after 85 hours in this test. Thus, even under more aggressive hydrolysis conditions, calcined, coated powder show significantly improved stability over non-calcined powders.

10. Coated AlN powders were prepared in a similar manner to that of Sample Q and Sample R, (Samples S and T respectively), with the exception that sample T was calcined at 1100° C. Both samples were subjected to mechanical abrasion by milling them in a Waring-type blender for 5 minutes to simulated process-related damage that might be observed in the use of coated powders for filled polymer applications. Following the abrasion test, both samples types were subjected to HAST testing as described in example 9. Sample S exhibited significant weight gain after 21 hours of exposure (~0.80% weight gain) and exceeded 1% (1.2%) after 42 hours of exposure. Sample T exhibited only 0.25% weight gain after 42 hours exposure. Thus, it was observed that the calcined coating was more damage tolerant than uncalcined coatings, and even after being subjected to significant mechanical abrasion, resisted water permeation and hydrolysis of the AlN core particle.

While my invention has been described in terms of a specific embodiment, it will be appreciated that other embodiments could readily be adapted by one skilled in the art. Therefore, the invention should not be limited to the embodiments so disclosed but should be deemed to encompass additional embodiments considered obvious to one skilled in the art.

I claim:

1. A silica coated inorganic ceramic powder, wherein the surface area of the coated powder is essentially unchanged as compared to the uncoated inorganic ceramic powder.

2. The silica coated inorganic ceramic powder of claim 1, wherein the inorganic ceramic powder is aluminum nitride.

3. The silica coated inorganic ceramic powder of claim 1, wherein the inorganic ceramic powder magnesium oxide.

4. The silica coated aluminum nitride powder of claim 2, wherein the silica coating is essentially fully dense.

5. The silica coated aluminum nitride powder of claim 2, wherein the silica coating exhibits only closed porosity.

6. The silica coated aluminum nitride powder of claim 2, wherein the silica coating content ranges from about 1% to 10% by weight.

7. The silica coated aluminum nitride powder of claim 2, wherein the silica coating content ranges from about 2% to 6% by weight.

8. A silica coated aluminum nitride powder which does not exceed about 1% weight gain when exposed to 85% relative humidity at 85° C. for greater than about 600 consecutive hours.

9. The silica coated aluminum nitride powder of claim 8, wherein the silica coating is essentially fully dense.

10. The silica coated aluminum nitride powder of claim 8, wherein the silica coating exhibits only closed porosity.

11. The silica coated aluminum nitride powder of claim 8, wherein the silica coating content ranges from about 1% to 10% by weight.

12. The silica coated aluminum nitride powder of claim 8, wherein the silica coating content ranges from about 2% to 6% by weight.

13. A silica coated aluminum nitride powder, wherein the silica coating exhibits a surface area of less than about 2 $m^2/gm$.

14. The silica coated aluminum nitride powder of claim 13, wherein the silica coating content ranges from about 1% to 10% by weight.

15. The silica coated aluminum nitride powder of claim 13, wherein the silica coating content ranges from about 2% to 6% by weight.

16. A silica coated aluminum nitride powder, wherein the surface area of the coated powder is increased by no more than about 2 $m^2/gm$ as compared to the surface area of the original, uncoated aluminum nitride powder.

17. The silica coated aluminum nitride powder of claim 16, wherein the silica coating content ranges from about 1% to 10% by weight.

18. The silica coated aluminum nitride powder of claim 16, wherein the silica coating content ranges from about 2% to 6% by weight.

* * * * *